United States Patent
Ahn et al.

(10) Patent No.: US 7,839,137 B2
(45) Date of Patent: Nov. 23, 2010

(54) DISTRIBUTED RF/MICROWAVE POWER DETECTOR

(75) Inventors: Jongshick Ahn, San Diego, CA (US); William R. Eisenstadt, Gainesville, FL (US); Robert M. Fox, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 259 days.

(21) Appl. No.: 11/996,257

(22) PCT Filed: Jul. 19, 2006

(86) PCT No.: PCT/US2006/027870
§ 371 (c)(1),
(2), (4) Date: Jul. 11, 2008

(87) PCT Pub. No.: WO2007/011944
PCT Pub. Date: Jan. 25, 2007

(65) Prior Publication Data
US 2008/0309321 A1    Dec. 18, 2008

Related U.S. Application Data

(60) Provisional application No. 60/700,707, filed on Jul. 19, 2005.

(51) Int. Cl.
*G01R 19/00* (2006.01)
*G01R 1/30* (2006.01)
(52) U.S. Cl. .................................. 324/123 R; 324/76.11

(58) Field of Classification Search .................. None
See application file for complete search history.

(56) References Cited

U.S. PATENT DOCUMENTS 2,515,187 A    7/1950    Bliss (Continued)

FOREIGN PATENT DOCUMENTS

WO    WO 97/22183    6/1997

OTHER PUBLICATIONS

Tao Zang et al., A novel 5Ghz RF power detector, Circuits & Systems, 2004, ISCAS '04 Proceedings of the 2004 Int'l Symposium on Vancouver, BC, Canada, May 23-26, 2004, pp. I-897.

*Primary Examiner*—Paresh Patel
(74) *Attorney, Agent, or Firm*—Saliwanchik, Lloyd & Saliwanchik

(57) ABSTRACT

A distributed RF/microwave power detector for detecting the power of a signal is provided. The distributed RF/microwave power detector includes a power detector on or at least partially embedded in a single substrate. The distributed RF/microwave power detector includes a detection unit that has a distributed amplifier for amplifying the signal and outputting an amplified signal, and a detector for detecting the power of the amplified signal. The distributed RF/microwave power detector further includes at least one additional detection unit cascaded with the first. The additional detection unit includes an additional distributed amplifier for amplifying the amplified signal and outputting a further amplified signal, as well as an additional detector for detecting a power of the further amplified signal. The distributed RF/microwave power detector also includes a multiplexer for multiplexing outputs of the detector and at least one additional detector, each having a dynamic range different from the other.

19 Claims, 6 Drawing Sheets

U.S. PATENT DOCUMENTS

| | | | |
|---|---|---|---|
| 2,912,506 A * | 11/1959 | Hughes | 370/521 |
| 3,435,353 A | 3/1969 | Sauber | |
| 3,605,027 A * | 9/1971 | Nichols et al. | 327/351 |
| 5,070,303 A * | 12/1991 | Dent | 327/351 |
| 5,298,811 A * | 3/1994 | Gilbert | 327/351 |
| 2003/0157913 A1 | 8/2003 | Rozsypal | |

* cited by examiner

DISTRIBUTED RF/MICROWAVE POWER DETECTOR

CROSS-REFERENCE TO RELATED APPLICATIONS

This application is a §371 national stage entry of International Application No. PCT/US2006/027870, filed Jul. 19, 2006, which claims the benefit of U.S. Provisional Application No. 60/700,707, filed Jul. 19, 2005, both of which are hereby incorporated by reference.

FIELD OF THE INVENTION

The present invention is related to the field of high-frequency electronic circuits, and, more particularly, to the testing of such circuits.

BACKGROUND

A monolithic radio frequency/microwave power detector, implemented for example as a bipolar or complementary metal-oxide semiconductor device, would offer a number of advantages for embedded testing of a radio frequency (RF) integrated circuit (IC). The advantages of such a detector include its simplicity, wide bandwidth, low power consumption, small chip size, and temperature stability.

Notwithstanding these advantages, a persistent problem posed by the use of such a detector is its wide crossover region. As with any bipolar-based peak detector, the crossover region of the detector is its region of operation, which lies between a region in which the detector exhibits high-voltage linear behavior and another region in which the detector exhibits low-voltage square-law behavior. It is difficult to predict the strength of an input signal accurately when a device operates in the crossover region; preferably, signal detection occurs with the device operating in the region in which it exhibits high-voltage linear behavior.

Accordingly, in the context of providing an on-chip detector for small-signal power detection, there is a need for a detector that effectively and efficiently amplifies the signal prior to its detection.

SUMMARY OF THE INVENTION

The present invention provides a distributed peak-power detector that effectively provides power detection of small signals over a substantially larger range of frequencies. The distributed peak-power detector is a combined circuit that includes a plurality of cascaded single-stage distributed amplifiers, a plurality of distributed power detectors electrically connected to the amplifiers, and a multiplexer electrically connected to each of the distributed power detectors.

A distributed RF/microwave power detector for detecting the power of a signal, according to one embodiment, is a power detector disposed on or at least partially embedded in a single substrate. The distributed RF/microwave power detector can include a detection unit disposed on or in the substrate. The detection unit can comprise a distributed amplifier for amplifying the signal and outputting an amplified signal, and a detector for detecting a power of the amplified signal. The distributed RF/microwave power detector can further include at least one additional detection unit disposed on or in the substrate and cascaded with the detection unit. The additional detection unit can comprise an additional distributed amplifier for amplifying the amplified signal and outputting a further amplified signal, as well as an additional detector for detecting a power of the further amplified signal.

The distributed RF/microwave power detector can also include a multiplexer disposed on or in the substrate for multiplexing outputs of the detector and at least one additional detector. Each detector can have a dynamic range different from the dynamic range of the other.

Another embodiment of the present invention is a method for performing distributed RF/microwave peak-power detection. The method can include receiving a small signal input, and successively amplifying the small signal input a plurality of times to thereby generate a plurality of differently amplified signal outputs. The method further can include detecting a power level of the amplified small signal after each successive amplification so that the small signal is detected within a linear region over an expanded, dynamic range.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

Figure 1:
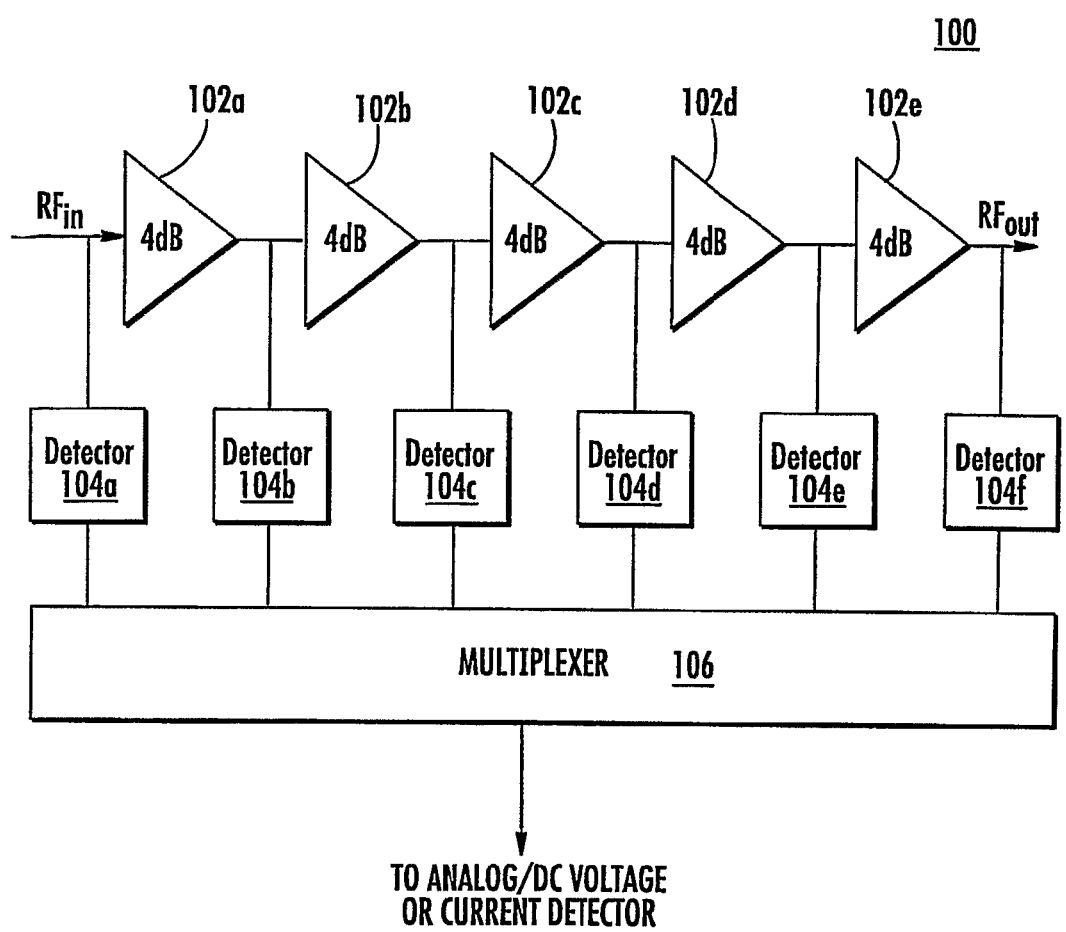
FIG. 1 is a schematic diagram of a distributed RF/microwave peak-power detector, according to one embodiment of the present invention.

Referring initially to FIG. 1, a distributed RF/microwave peak-power detector 100 according to one embodiment of the invention is schematically illustrated. As illustrated, the distributed RF/microwave peak-power detector 100 is a combined circuit that includes a plurality of single-stage distributed amplifiers 102a-e in a cascade arrangement. The distributed RF/microwave peak-power detector 100 further illustratively includes a plurality of distributed power detectors 104a-f that are electrically connected to the plurality of single-stage distributed amplifiers 102a-e. Additionally, the distributed RF/microwave peak-power detector 100 illustratively includes a multiplexer 106 to which each of the plurality of distributed power detectors 104a-f is electrically connected.

The plurality of cascaded single-stage distributed amplifiers 102a-e illustratively includes an initial single-stage distributed amplifier 102a, which has an input to receive an input signal, the voltage of which is to be detected by the distributed RF/microwave peak-power detector 100 during performance of an embedded RF test of an IC. The signal received by the distributed RF/microwave peak-power detector 100 can be generated by the IC in response to a test signal applied to the IC.

As also illustrated, the plurality of cascaded single stage distributed amplifiers 102a-e additionally includes a terminal single-stage distributed amplifier 102e as well as three intermediate single-stage distributed amplifiers 102b, 102c, 102d. Although the distributed RF/microwave peak-power detector 100 is here illustrated as having three intermediate single-stage distributed amplifiers 102b, 102c, 102d, it will be understood from the description herein that in alternate embodiments the distributed RF/microwave peak-power detector could have more than the exemplary three intermediate single-stage distributed amplifiers shown. In still other embodiments, the distributed RF/microwave peak-power detector could have only two intermediate single-stage distributed amplifiers or even just one intermediate single-stage distributed amplifier.

The plurality of distributed power detectors 104a-f illustratively comprises a first distributed power detector 104a which is connected to the input to the initial single-stage distributed amplifier 102a. Additionally, the plurality of distributed power detectors 104a-f further includes a terminal distributed power detector 104f as well as four intermediate distributed power detectors 104b, 104c, 104d, 104e disposed between the initial and final distributed power detectors. Each successive intermediate distributed power detector, as illustrated, is electrically connected between the output of one single-stage distributed power amplifier and the input of a succeeding distributed power amplifier. The terminal distributed power detector 104f is connected to the output of the terminal single-stage distributed power amplifier 102e.

Operatively, the cascaded single-stage distributed amplifiers 102a-e of the distributed RF/microwave peak-power detector 100 each act as gain cells. Accordingly, each of the cascaded single-stage distributed amplifiers 102a-e operates to amplify a received small signal, amplifying the signal up to a linear detection region prior to the power level of the signal being detected by a corresponding one of the distributed power detectors 104a-f; that is, at each stage of the cascaded arrangement, a distributed power detector detects the power of the amplified signal at the output of signal-stage distributed amplifier to which the particular distributed power detector is electrically connected. Thus, the gain from the proper linear gain stage of the distributed RF/microwave peak-power detector 100 can be readily determined. An output of the multiplexer 106, as illustrated, is conveyed to an analog/DC voltage or current detector.

Illustratively, each of the cascaded single-stage distributed amplifiers 102a-e amplifies a received signal by 4 dB. It is to be understood, however, that in other embodiments different levels of amplification can be performed on a received signal. Moreover, according to still other embodiments, the degree of amplification need not be equal at each stage.

The gain response of each such cell defined by a particular one of the cascaded signal stage single-stage distributed amplifiers 102a-e, and the distributed power detected by a detector attached to the output of the amplifier is initially flat and remains so up to a pre-established frequency. The initial distributed power detector 104a connected to the input of the initial single-stage distributed amplifier 102a defines an upper limit of the dynamic range provided by the distributed RF/microwave peak-power detector 100. The terminal distributed power detector 104f connected to the output of the terminal single-stage distributed power amplifier 102e defines a lower limit. The combination of intermediate single-stage distributed power amplifiers 102b-d and intermediate distributed power detectors 104b-e cover the middle range of the input signal.

The arrangement so described enables detection of the peak power of a small-signal input using the linear detection region of each of the distributed power detectors 104a-f. As will be readily understood by one of ordinary skill, the small signal can be a time-varying signal carried over a constant bias. By selecting the detector output through the multiplexer 106, the linear transfer characteristics over a wide dynamic range can be obtained based upon the input signal and used for making determinations about the circuit supplying the input signal to the distributed RF/microwave peak-power detector 100.

Figure 2:
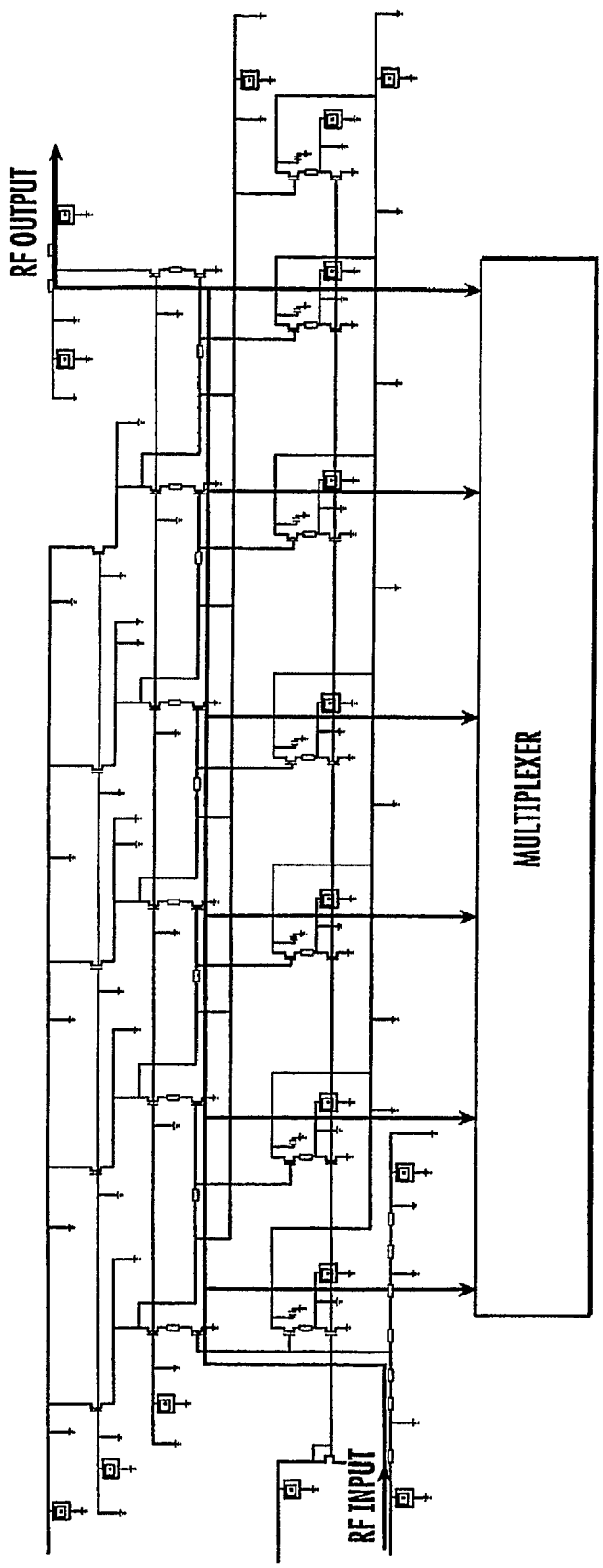
FIG. 2 is a schematic diagram of an electronic circuit for implementing a distributed RF/microwave peak-power detector, according to another embodiment of the present invention.

Referring additionally to FIG. 2, an electronic circuit 200 for implementing -a distributed RF/microwave peak-power detector is schematically illustrated. The electronic circuit 200 performs the operations described in the context of the previously described distributed RF/microwave peak-power detector.

Figure 3:
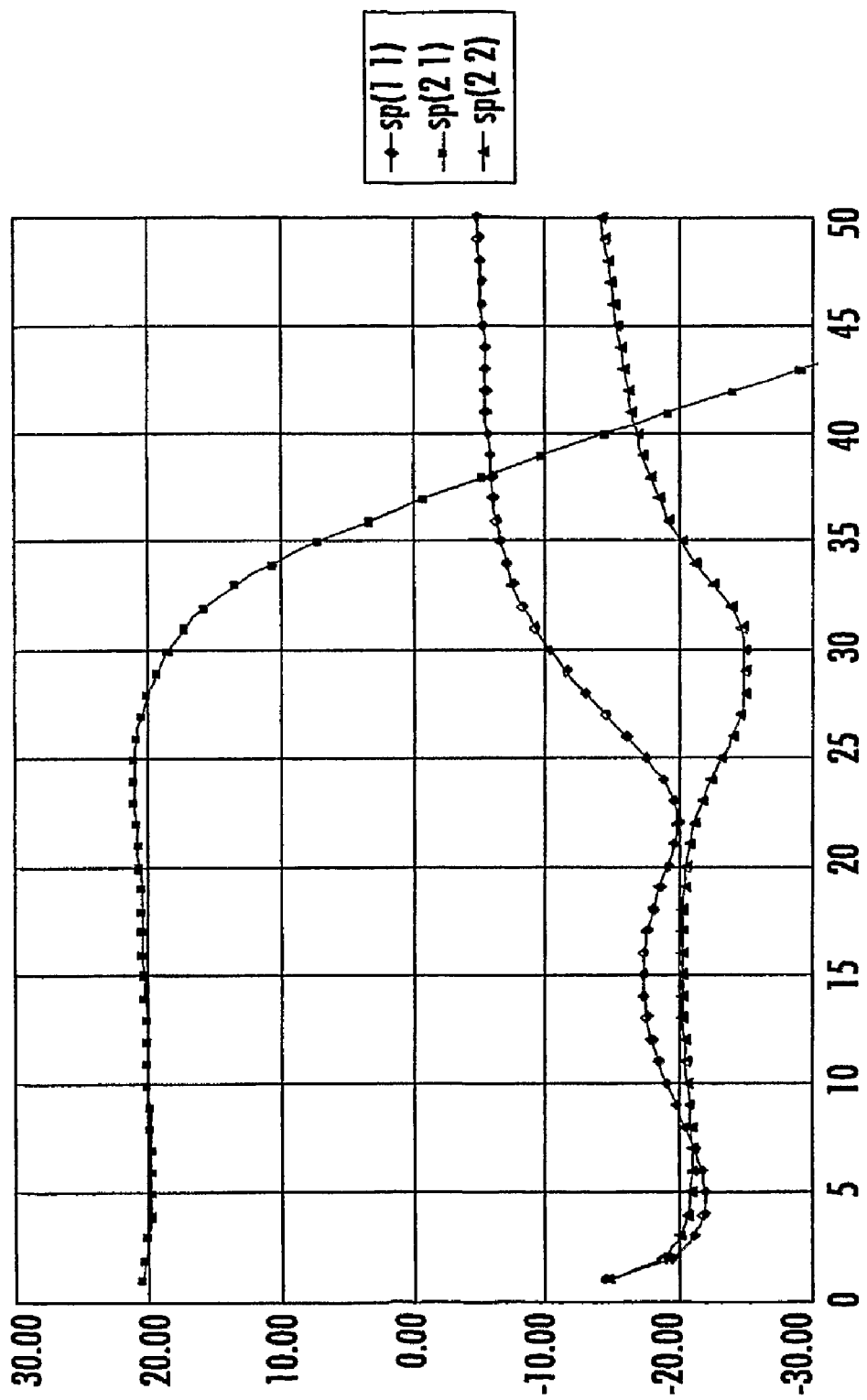
FIG. 3 is plot of s-parameter results obtained from a simulation of a six-stage distributed RF/microwave peak-power detector, according to yet another embodiment of the present invention.
Figure 4:
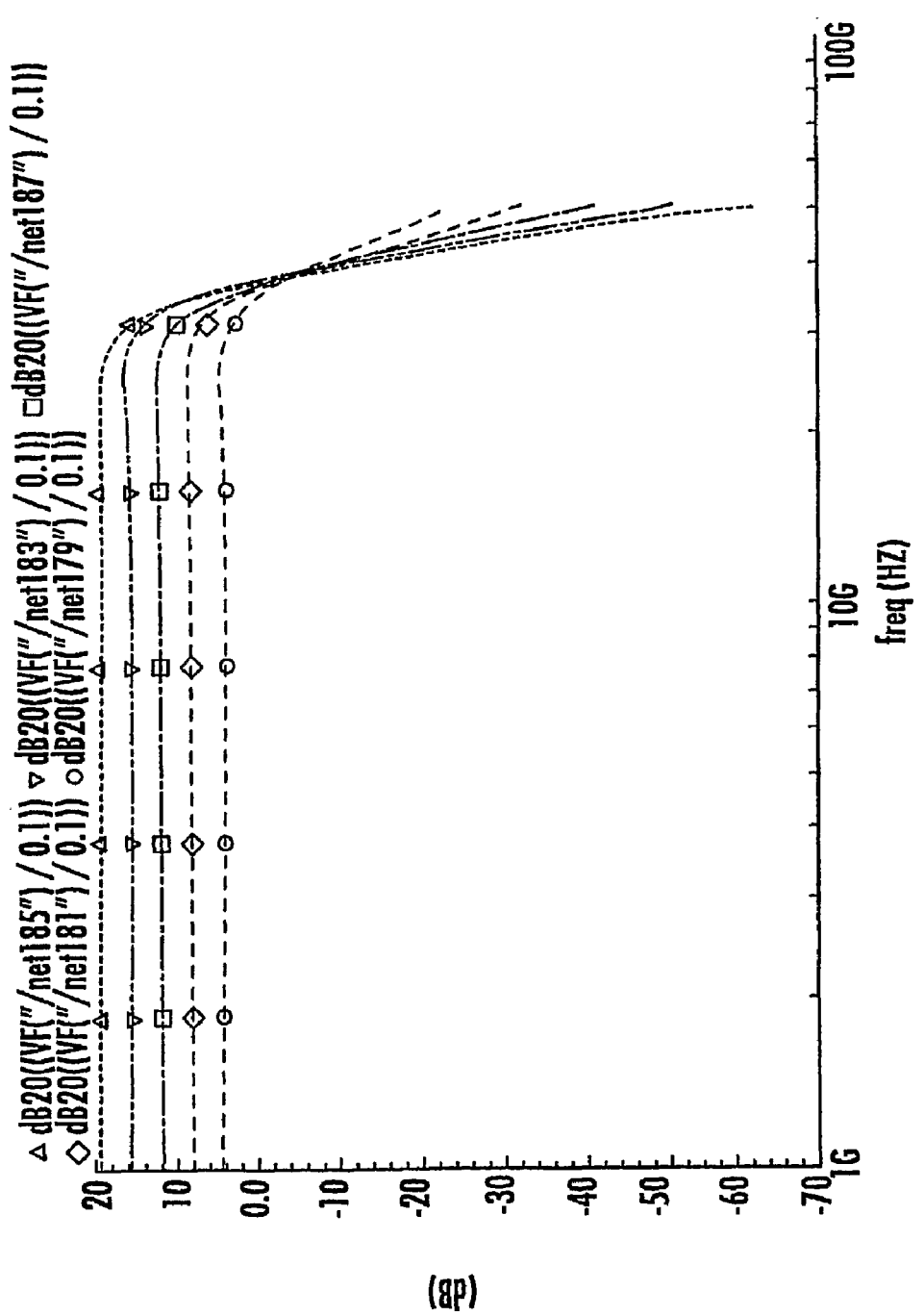
FIG. 4 is plot of the gain (in decibels, dB) over a range of frequencies for each stage of the simulated six-stage distributed RF/microwave peak-power detector referred to in FIG. 3.
Figure 5:
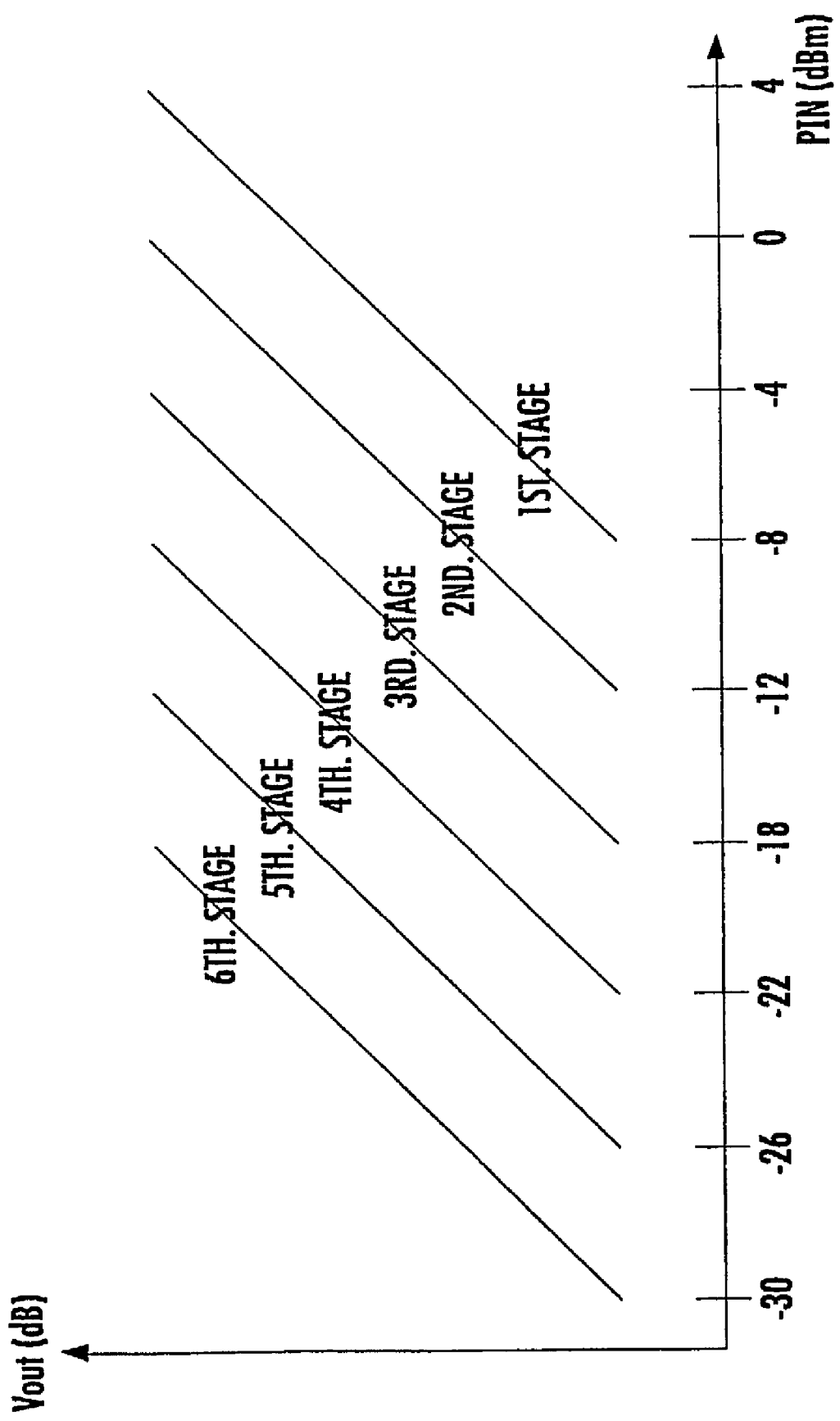
FIG. 5 is a plot of the overall transfer characteristics curves obtained for each stage of the simulated six-stage distributed RF/microwave peak-power detector referred to in FIG. 3.

Referring now to FIG. 3, results are provided of s-parameter simulations performed with respect to a six-stage distributed RF/microwave peak-power detector according to one embodiment. The gain response, sp(2 1), at each stage as determined through these simulations is illustrated by the plots of decibel gain (dB) versus frequency in FIG. 4. As shown, the gain response of each stage is flat up to an intended frequency. The corresponding transfer characteristics are shown in FIG. 5. Again, as illustrated, the RF detector connected directly to the input defines an upper end of the dynamic range encompassed by the simulated six-stage distributed RF/microwave peak-power detector. The last-stage detector defines the lower end of the dynamic range. The intermediate stages cover the middle range of the input signal, as described above. By selecting the output through a multiplexer, the linear transfer characteristic within a wide dynamic range can be utilized.

Figure 6:
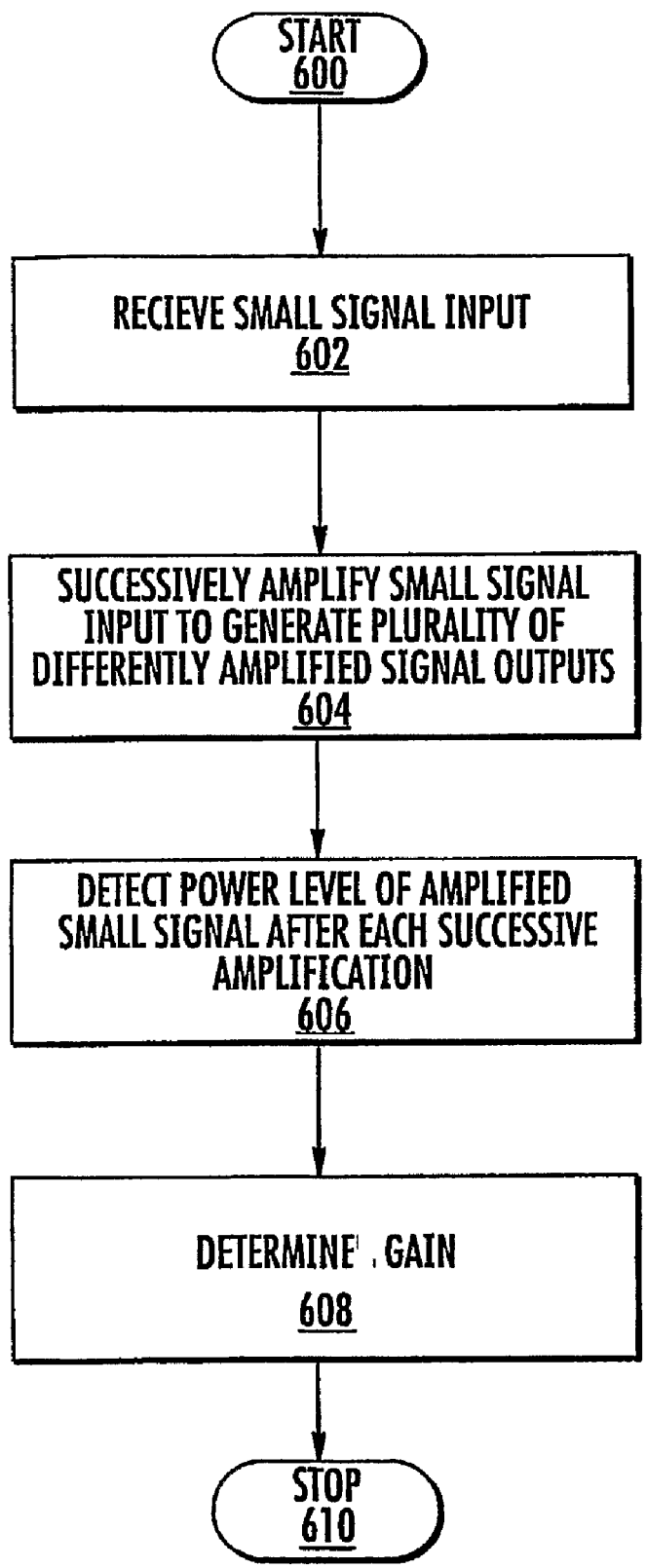
FIG. 6 is a flowchart of a method for performing distributed RF/microwave peak-power detection, according to still another embodiment of the present invention.

Referring now to FIG. 6, a flowchart illustrates the exemplary steps of a method for performing distributed RF/microwave peak-power detection, according to still another embodiment of the present invention. The method 600 illustratively includes, at step 602, receiving a small signal input. At step 604, the small signal input is successively amplified so as to generate a plurality of differently amplified signal outputs, each amplification defining a linear gain stage. The method 600 illustratively continues, at step 606, by detecting a power level of the amplified small signal after each successive amplification such that the small signal is detected within a linear region over an expanded, dynamic range. At step 608, a gain from the proper linear gain stage is determined. The method illustratively concludes at step 610.

It will be apparent from the description provided herein that various embodiments of a distributed RF/microwave peak-power detector according to the present invention can be used to monitor and control the performance, for example, of a power amplifier. In still another embodiment, the distributed RF/microwave peak-power detector can be utilized for embedded RF testing, such as by making on-chip s-parameter measurements. The distributed RF/microwave peak-power detector likewise can be used for monitoring a low-noise amplifier (WA), a signal mixer, voltage-controlled oscillator (WO), or a host of other electronic devices.

This invention can be embodied in other forms without departing from the spirit or essential attributes thereof. Accordingly, reference should be made to the following claims, rather than to the foregoing specification, as indicating the scope of the invention.

We claim:

1. A distributed RF/microwave power detector for detecting a power of a signal, the power detector comprising:
   a substrate;
   a first-stage detection unit disposed on or in the substrate, the first-stage detection unit comprising a first-stage distributed amplifier for amplifying the signal and outputting a first amplified signal and a first-stage detector for detecting a power of the first amplified signal;
   a second-stage detection unit disposed on or in the substrate and cascaded with the first-stage detection unit, the second-stage detection unit comprising a second stage distributed amplifier for amplifying the first amplified signal and outputting a second amplified signal, and a second-stage detector for detecting a power of the second amplified signal; and
   a multiplexer disposed on or in the substrate for multiplexing outputs of the first-stage and second-stage detectors;
   wherein the first-stage detector and second-stage detector each has a dynamic range different from the dynamic range of the other.

2. The power detector of Claim 1, further comprising at least one additional detection unit having an additional-stage distributed amplifier and additional unit detector, the additional unit detector electrically connected to the multiplexer.

3. The power detector of Claim 1, wherein the first amplified signal is amplified by the first-stage amplifier so that the first amplified signal lies in a first linear detection region, and wherein the second amplified signal is amplified by the second-stage amplifier so that the second amplified signal lies in a second linear detection region.

4. The power detector of Claim 1, further comprising a distributed power detector connected to an input of the first-stage distributed amplifier.

5. The power detector of Claim 1, wherein the first-stage distributed amplifier defines an initial distributed amplifier having a signal input and the second-stage distributed amplifier defines a terminal distributed amplifier having a signal output, and further comprising an initial distributed power detector connected to the signal input and a terminal distributed power detector connected to the signal output.

6. The power detector of Claim 5, further comprising at least one intermediate detection units disposed between the first-stage detection unit and the second-stage detection unit, each intermediate detection unit comprising an intermediate single-stage distributed power amplifier and an intermediate distributed power detector connected thereto.

7. A method of performing distributed RF/microwave peak-power detection, the method comprising:
   receiving a small-signal input;
   successively amplifying the small-signal input a plurality of times to thereby generate a plurality of differently amplified signal outputs;
   detecting a power level of the amplified small-signal input after each successive amplification such that the small-signal input is detected within a linear region over an expanded, dynamic range; and
   multiplexing differently amplified signal outputs.

8. The method of Claim 7, wherein successively amplifying the small signal input comprises successively amplifying the small-signal input using a plurality of cascaded single-stage distributed amplifiers.

9. The method of Claim 8, wherein detecting a power level comprises detecting an output of each of the cascaded single-stage distributed amplifiers.

10. A distributed RF/microwave power detector for detecting a power of a signal, the power detector comprising:
    a first-stage detection unit, the first-stage detection unit comprising a first-stage distributed amplifier for amplifying the signal and outputting a first amplified signal and a first-stage detector for detecting a power of the first amplified signal;
    a second-stage detection unit cascaded with the first-stage detection unit, the second-stage detection unit comprising a second stage distributed amplifier for amplifying the first amplified signal and outputting a second amplified signal, and a second-stage detector for detecting a power of the second amplified signal; and
    a multiplexer for multiplexing outputs of the first-stage and second-stage detectors;
    wherein the first-stage detector and second-stage detector each has a dynamic range different from the dynamic range of the other.

11. The power detector of Claim 10, further comprising a substrate wherein at least one of the first-stage detection unit and the second-stage detection unit are disposed on or embedded in the substrate.

12. The power detector of Claim 10, further comprising at least one additional detection unit having an additional-stage distributed amplifier and additional unit detector, the additional unit detector electrically connected to the multiplexer.

13. The power detector of Claim 10, wherein the first amplified signal is amplified by the first-stage amplifier so that the first amplified signal lies in a first linear detection region, and wherein the second amplified signal is amplified by the second-stage amplifier so that the second amplified signal lies in a second linear detection region.

14. The power detector of Claim 10, further comprising a distributed power detector connected to an input of the first-stage distributed amplifier.

15. The power detector of Claim 10, wherein the first-stage distributed amplifier defines an initial distributed amplifier having a signal input and the second-stage distributed amplifier defines a terminal distributed amplifier having a signal output and further comprising an initial distributed power detector connected to the signal input and a terminal distributed power detector connected to the signal output.

16. The power detector of Claim 15, further comprising at least one intermediate detection units disposed between the first-stage detection unit and the second-stage detection unit, each intermediate detection unit comprising an intermediate single-stage distributed power amplifier and an intermediate distributed power detector connected thereto.

17. A method of detecting a power of a signal, the method comprising:
    providing a detection unit having a distributed amplifier for amplifying the signal and outputting an initial amplified signal and a detector for detecting a power of the initial amplified signal;
    providing at least one additional detection unit in cascade with the detection unit and having a distributed amplifier for amplifying the initial amplified signal and outputting a subsequent amplified signal and a detector for detecting a power of the subsequent amplified signal;
    providing a multiplexer for multiplexing outputs of the detectors of the detection unit and at least one additional detection unit, wherein each of the detectors has a dynamic range different from the dynamic range of the other receiving a small-signal input;
    successively amplifying the small-signal input a plurality of times to thereby generate a plurality of differently amplified signal outputs; and detecting a power level of the amplified small-signal input after each successive amplification such that the small-signal input is detected within a linear region over an expanded, dynamic range.

18. The method of Claim 17, further comprising multiplexing differently amplified signal outputs.

19. The method of Claim 17, wherein successively amplifying the small signal input comprises successively amplifying the small-signal input using a plurality of cascaded single-stage distributed amplifiers.

* * * * *

UNITED STATES PATENT AND TRADEMARK OFFICE
CERTIFICATE OF CORRECTION

| | | |
|---|---|---|
| PATENT NO. | : 7,839,137 B2 | Page 1 of 1 |
| APPLICATION NO. | : 11/996257 | |
| DATED | : November 23, 2010 | |
| INVENTOR(S) | : Jongshick Ahn et al. | |

It is certified that error appears in the above-identified patent and that said Letters Patent is hereby corrected as shown below:

Column 3,
Line 57, "signal stage single-stage" should read --single-stage--.

Signed and Sealed this
Fifteenth Day of February, 2011

David J. Kappos
*Director of the United States Patent and Trademark Office*